United States Patent [19]
Li

[11] Patent Number: 5,986,493
[45] Date of Patent: Nov. 16, 1999

[54] CLAMPING CIRCUIT AND METHOD FOR CLAMPING A VOLTAGE

[75] Inventor: Larry B. Li, Plano, Tex.

[73] Assignee: Texas Instruments Incorporated, Dallas, Tex.

[21] Appl. No.: 08/958,821

[22] Filed: Oct. 28, 1997

Related U.S. Application Data

[60] Provisional application No. 60/029,271, Oct. 28, 1996.

[51] Int. Cl.$^6$ ...................................................... H03K 5/08
[52] U.S. Cl. .......................... 327/328; 327/313; 327/312; 327/323
[58] Field of Search .................................... 327/309, 313, 327/327, 328, 312, 323, 539

[56] References Cited

U.S. PATENT DOCUMENTS

| | | | |
|---|---|---|---|
| 4,571,511 | 2/1986 | Dischert et al. | 327/312 |
| 5,420,499 | 5/1995 | DeShazo | 323/315 |
| 5,594,382 | 1/1997 | Kato et al. | 327/541 |
| 5,834,927 | 11/1998 | Sugawara | 327/539 |

*Primary Examiner*—Terry D. Cunningham
*Attorney, Agent, or Firm*—W. Daniel Swayze, Jr.; Wade James Brady, III; Richard L. Donaldson

[57] ABSTRACT

A clamping circuit (100) is provided for controlling an external switch, using a control signal, in response to monitoring a voltage at a first node. When the voltage at the first node exceeds a certain voltage, the clamping circuit (100) closes the external switch to complete a current path to reduce the voltage at the first node. The clamping circuit (100) includes a voltage divider circuit, a first device, a second device, a current mirror circuit, and a switch. The voltage divider circuit, which may be implemented using a resistor (30) and a resistor (32), is coupled between the first node and a fourth node and generates a divider voltage at a third node that is proportional to the voltage at the first node. The first device and the second device may be implemented using a first bipolar junction transistor (38) and a second bipolar junction transistor (40), respectively. The first device receives the divider voltage and generates a first current, and the second device receives the divider voltage and generates a second current in response. The current mirror circuit receives the first current and mirrors the first current to the second device where a reference signal is generated at a second node that corresponds to the initial difference between the first current and the second current. The current mirror device may be implemented using a FET (34) and a FET (36). The switch, which may be implemented as FET (50), receives the reference signal and provides the control signal to the external switch when the reference signal is received at an amplitude that exceeds a threshold level.

16 Claims, 1 Drawing Sheet

CLAMPING CIRCUIT AND METHOD FOR CLAMPING A VOLTAGE

This application claims benefit of Provisional Appln Ser. No. 60/029,271 filed Oct. 28, 1996.

TECHNICAL FIELD OF THE INVENTION

This invention relates generally to the field of control circuitry and more particularly to a clamping circuit and method for clamping a voltage, such as the voltage generated in a stator winding coil of a polyphase dc motor.

BACKGROUND OF THE INVENTION

A variety of applications use polyphase direct current (dc) spindle motors to generate rotational motion. In particular, applications such as hard disk drives and CD-ROM type drives often use polyphase dc spindle motors, such as three-phase dc motors, to rotate information platters such as the magnetic disks of a hard disk drive. Three-phase dc motors are brushless motors that generate rotational motion by selectively or commutatively providing six currents through sets or pairs of coils in a stator winding using a commutation control circuitry.

The speed of the rotational motion is controlled through the six currents applied to the stator winding coils. For example, the stator windings of a three-phase dc motor may be coupled in a "Y" configuration and include an A-coil, a B-coil, and a C-coil, all coupled at one end at a center tap node. The remaining ends of each coil are selectively or commutatively coupled to either a high side driver, a low side driver, or to an open circuit, as controlled by the commutation control circuitry.

During steady state operation, current flows from a high side driver, through a first coil coupled to the high side driver, through the center tap, through a second coil coupled to the low side driver, and to the low side driver. During this time, a third coil couples to the center tap on one end while the other end is provided as an open circuit. After a period of time, a commutation occurs so that current may now flow through the third coil and either the first coil or the second coil. A commutation is the transfer of current from one path in a circuit to another. Thus, current flows through the first coil and the second coil during a steady state operation until a commutation occurs, at which time, current then flows through either the first or the second coil and the third coil until the next commutation occurs.

A total of six currents may be provided in the stator windings of a three-phase dc motor through six commutations. The current flows, for example, may be provided through the stator coils in the following sequence: A-coil to C-coil, A-coil to B-coil, C-coil to B-coil, C-coil to A-coil, B-coil to A-coil, and B-coil to C-coil.

Each stator winding coil includes an associated resistance and inductance. As the current through a stator winding coil is switched off, as a result of a commutation or because the power is shut off, the inductance of the stator winding coil generates a corresponding inductive voltage spike according to the equation: V=L(di/dt). This voltage spike may also be referred to as a flyback voltage or inductive "kick," and is generated in response to the changing current in the coil. The inductive voltage spike, if uncontrolled, often will exceed the breakdown voltage of the associated control circuitry, such as the commutation control circuitry, resulting in its destruction.

The inductive voltage spike may be controlled using either an external or an internal Schottky power diode to provide a current path to dissipate the energy stored in the coil. These diodes may provide a current path to dissipate, for example, up to two amps. The Schottky power diodes are provided for each coil of the stator winding and may be discrete, external Schottky power diodes or internal Schottky power diodes fabricated as part of an integrated circuit. Problems arise when using Schottky power diodes to control the inductive voltage spike. External Schottky power diodes are expensive, about twenty-five cents a piece, bulky, and add significantly to overall circuitry cost. Internal Schottky power diodes take considerable die or circuit area resulting in significantly larger overall integrated circuitry.

Other solutions to the flyback voltage problem include the use of active devices, such as comparators, to continually monitor a voltage to determine if it exceeds a particular reference voltage. If the monitored voltage exceeds the reference voltage, other circuitry may be implemented to dissipate or reduce the voltage. However, these solutions suffer a serious drawback. The use of active devices, such as the comparators, require a power supply voltage, and thus, the circuitry will not operate when power is shut off during power down or in the event of a power loss. When power is shut off or lost, the currents through the stator winding coils are changing and, hence, are generating flyback or inductive voltages at high levels. These flyback voltages often exceed the breakdown voltage of the control circuitry resulting in its destruction.

SUMMARY OF THE INVENTION

From the foregoing it may be appreciated that a need has arisen for a clamping circuit and method for clamping a voltage, such as a flyback voltage generated by the inductance of a stator winding coil of a polyphase dc motor after current is reduced or eliminated. In accordance with the present invention, a clamping circuit and method for clamping a voltage are provided that substantially eliminate the disadvantages and problems outlined above.

According to the present invention, a clamping circuit is provided for controlling an external switch in response to monitoring a voltage at a first node. When the voltage at the first node exceeds a certain level indicating that the voltage is too high, the clamping circuit closes the external switch to complete a current path to reduce the voltage at the first node.

The clamping circuit includes a voltage divider circuit, a first device, a second device, a current mirror circuit, and a switch. The voltage divider circuit couples to the first node at a first end and a fourth node at a second end and generates a divider voltage at a third node that is proportional to the voltage at the first node. The first device, which may be implemented using a transistor and a trigger point resistor, receives the divider voltage and generates a first current in response. The second device, which may be implemented using a transistor, also receives the divider voltage and generates a second current in response. The current mirror circuit mirrors the first current from the first device to the second device at a second node to generate a reference signal at the second node. The reference signal corresponds to the initial difference between the first current and the second current. The switch receives the reference signal and provides a control signal to the external switch when the reference signal is received at an amplitude that exceeds a threshold level.

The present invention provides various technical advantages. A technical advantage of the present invention includes the elimination of external power Schottky diodes that add significantly to overall circuitry costs. Another technical advantage includes the elimination of internal power Schottky diodes that consume considerable die or circuit area resulting in significantly larger overall integrated circuitry. Yet another technical advantage of the present invention includes increased reliability due to the ability to clamp flyback voltages at levels below breakdown voltages even when power is shut off or removed. Still another technical advantage includes the ability to clamp flyback voltages without affecting the operation of other circuitry. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
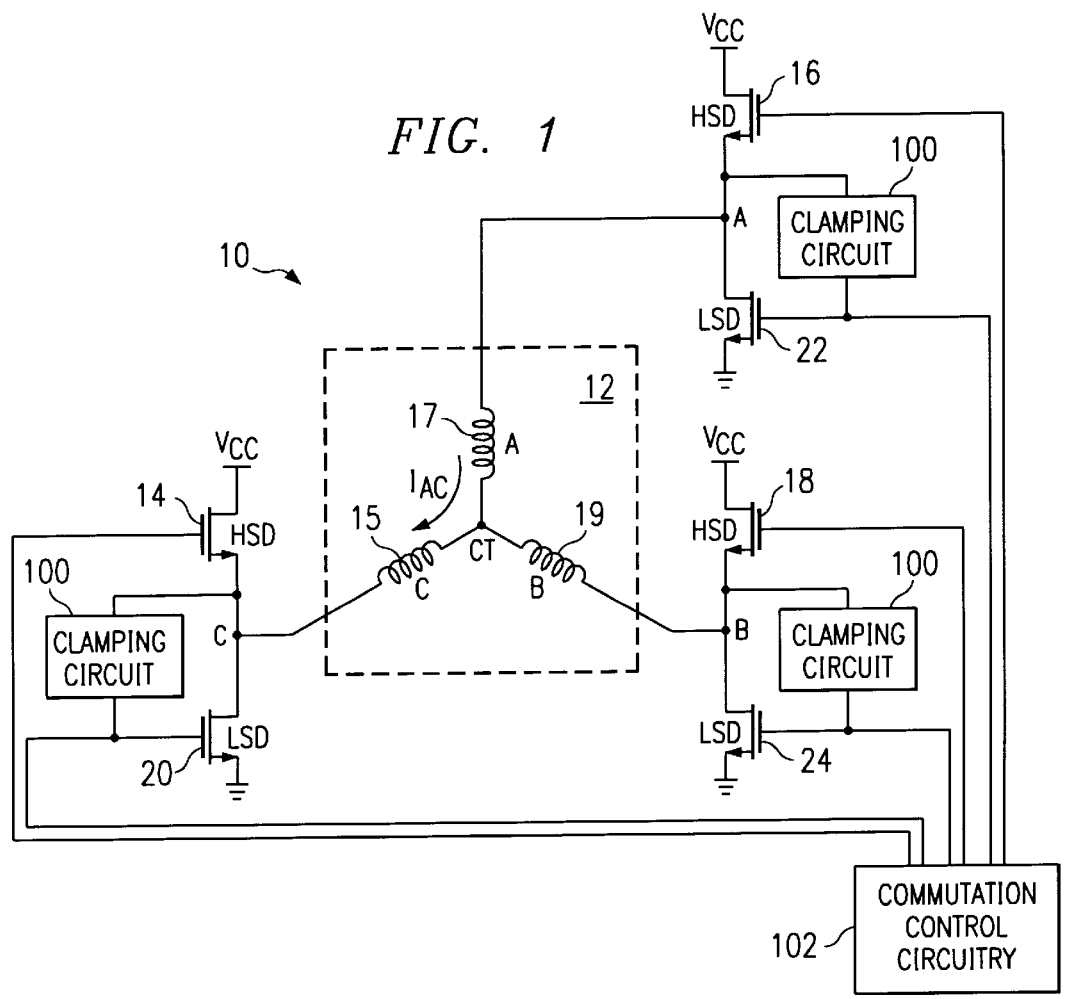
FIG. 1 is a circuit and block diagram illustrating a stator winding current regulation circuit.
Figure 2:
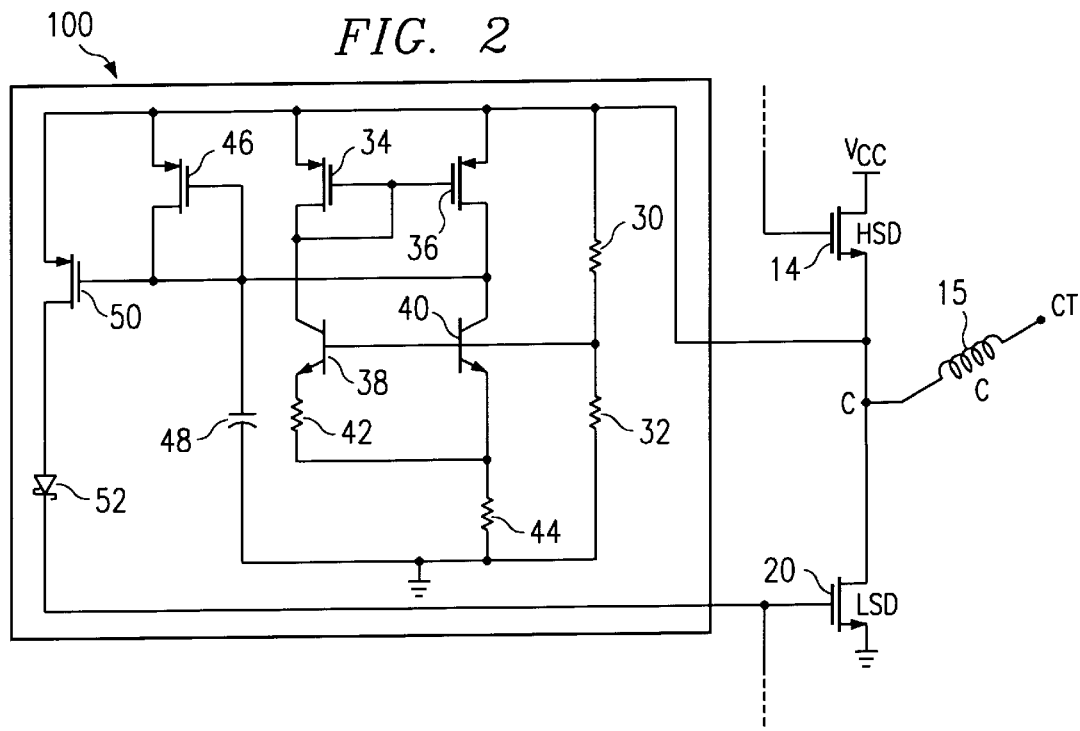
FIG. 2 is a circuit diagram illustrating a clamping circuit of the stator winding current regulation circuit.

FIG. 1 is a circuit and block diagram illustrating a stator winding current regulation circuit 10. Stator winding current regulation circuit 10 includes a commutation control circuitry 102, used to control and commutate the current through a stator winding 12, and a clamping circuit 100, used to clamp the voltage at each of the coils of stator winding 12. The details of clamping circuit 100 are illustrated in FIG. 2 and described more fully below. Stator winding 12 is a stator winding that may be used in a three-phase dc motor, such as a spindle motor that rotates the disks of a hard disk drive, and includes an A-coil 17, a B-coil 19, and a C-coil 15 coupled in a "Y" configuration. A first end of each of these coils is connected to a center tap and a second end of each is coupled to respective high side drivers and low side drivers. A-coil 17 couples to a high side driver (HSD) 16 and a low side driver (LSD) 22, B-coil 19 couples to an HSD 18 and an LSD 24, and C-coil 15 couples to an HSD 14 and an LSD 20.

Commutation control circuitry 102 is used to control the commutation and the flow of current through sets or pairs of stator winding coils. Current flows from a high side driver at a second end of a first coil, through the first coil and center tap, through a second coil, and to a low side driver coupled to the second end of the second coil. The current flowing through the first coil and the second coil may be controlled by commutation control circuitry 102 by regulating the gate-to-source voltage of the low side driver. After a period of time, commutation control circuitry 102 initiates a commutation so that current may be provided through another set of stator winding coils. A low side commutation occurs when switching from one low side driver to another low side driver, and a high side commutation occurs when switching from one high side driver to another high side driver.

For example, FIG. 1 illustrates the flow of current $I_{AC}$ through A-coil 17 and C-coil 15. $I_{AC}$ may be generated as a result of commutation control circuitry 102 operating HSD 16 as a closed switch so that a current can flow from supply voltage $V_{CC}$, through HSD 16, to A-coil 17 and C-coil 15. LSD 20, as controlled by commutation control circuitry 102, receives $I_{AC}$ and regulates $I_{AC}$ through its gate-to-source voltage. After a period of time, commutation control circuitry 102 initiates a commutation, such as a low side commutation, so that the current through C-coil 15 is reduced to zero. Current is now provided through A-coil 17 and B-coil 19 to generate a current $I_{AC}$.

As a result of the reduction of current through C-coil 15, an inductive voltage spike will be generated at node C that, if let to rise too high, may exceed the breakdown voltage of associated circuitry resulting in its destruction. Clamping circuit 100 clamps the voltage at node C at a safe level and prevents the inductive voltage spike from exceeding the breakdown voltage. Clamping circuit 100 will also clamp the voltage at node C that results when power is shut off or removed from stator winding current regulation circuit 10 resulting in the reduction of current through C-coil 15 to zero. Clamping circuit 100 does not require any external power supply to operate and hence will function even when power is shut off or removed.

A total of six currents may be provided through stator winding 12 through six commutations. The current flows, for example, may be provided through the stator coils in the following sequence: A-coil 17 to C-coil 15, A-coil 17 to B-coil 19, C-coil 15 to B-coil 19, C-coil 15 to A-coil 17, B-coil 19 to A-coil 17, and B-coil 19 to C-coil 15. The second end of each stator winding coil is coupled to a corresponding node where a clamping circuit 100 is provided. A-coil 17 couples to an A node, B-coil 19 couples to a B node, and C-coil 15 couples to node C. Clamping circuit 100 clamps the voltage at each of these nodes to prevent any inductive voltage spike from exceeding the breakdown voltage of associated circuitry.

Clamping circuit 100 also clamps the inductive voltage spike generated at each of the respective nodes when the current through the associated stator winding coil is switched off as a result of a commutation or because the power is shut off or removed. In one embodiment, clamping circuit 100 may be implemented as an integrated circuit and any inductive voltage spike provided at a negative value will generally be controlled by a parasitic diode present in the integrated circuit. Furthermore, although the low side drivers and high side drivers of FIG. 1 are shown implemented as NMOS transistors, any of a variety of other transistor types or technologies may have been implemented to perform the same functions. It should also be understood that although clamping circuit 100 will be described and shown as implemented using a three-phase dc motor having a three-phase stator winding, clamping circuit 100 is no way limited to a three-phase dc motor and may be used with a polyphase dc motor or in any other application requiring a voltage clamp.

FIG. 2 is a circuit diagram illustrating clamping circuit 100 coupled to node C between HSD 14 and LSD 20. Clamping circuit 100 prevents or "clamps" the voltage at node C from exceeding a certain level by controlling the gate of LSD 20. This is accomplished by providing a control signal to the gate of LSD 20 at a level that enables LSD 20 to act as a switch so as to provide a current path from node C to ground, thus dissipating or reducing the voltage at node C. For example, if the voltage at node C exceeds six volts, commutation control circuitry 102, as well as other associated electronic circuitry, may be damaged if the voltage continues to rise above a breakdown voltage level. The breakdown voltage may be related to the breakdown voltage of the field-effect transistor circuitry used in commutation control circuitry 102 and any associated circuitry. Clamping circuit 100 prevents or clamps the voltage at node C from rising above six volts by increasing the gate voltage of LSD 20 and so that LSD 20 acts as a closed switch whenever the voltage at node C exceeds six volts.

Clamping circuit 100 includes a resistor 30 and a resistor 32 that function as a voltage divider to provide a divider voltage to the base of a first bipolar junction transistor ("BJT") and a second BJT 40. The divider voltage thus establishes a base voltage to first BJT 38 and second BJT 40 to generate a current through these two devices. A first current $I_1$ is generated through first BJT 38 and a second current $I_2$ is generated through second BJT 40. A first end of a trigger point resistor 42 couples to the emitter of first BJT 38. A second end of trigger point resistor 42 couples to the emitter of second BJT 40 and a first end of a resistor 44 to assist with establishing $I_1$ and $I_2$. The values of $I_1$ and $I_2$ are also influenced by the relative size of first BJT 38 and second BJT 40. For example, first BJT 38 may be provided with an emitter area four times greater than the emitter area of second BJT 40.

After $I_1$ and $I_2$ are established by the divider voltage, a current mirror circuit mirrors $I_1$ from first BJT 38 to second BJT 40 at a second node. The current mirror circuit includes a FET 34 having its gate and drain coupled, and a second FET 36. The source of FET 34 and FET 36 couple to node C. $I_1$ is mirrored from FET 34 to FET 36 and is then provided at the second node. The second node includes the drain of FET 36 and the collector of second BJT 40. A reference signal in the form of a voltage is generated at the second node that corresponds to the initial difference between $I_1$ and $I_2$. A steady state is reached when the current being provided through FET 36 equals $I_2$.

The gate of a FET 50 is also coupled to the second node and is controlled by the reference voltage generated at the second node. FET 50 operates as a switch and is coupled between node C and the gate of LSD 20. FET 50 provides a current path from node C to the gate of LSD 20 so that a control signal may be provided to the gate of LSD 20. Once the gate of LSD 20 is provided at a high enough voltage by the control signal, LSD 20 acts as a closed switch and provides a current path from node C to ground resulting in the reduction of the voltage at node C.

A small diode 52, shown as a Schottky diode, having a turn-on voltage of around 0.65 volts is provided between the drain of FET 50 and the gate of LSD 20 to prevent current from flowing into clamping circuit 100 at this point. This could occur, for example, during the normal operation when LSD 20 is used to control the stator winding current through C-coil 15 and another coil of stator winding 12. Small diode 52 may, for example, be fabricated in an integrated circuit as a Schottky diode, a pn junction, or a bipolar junction transistor with the base and collector coupled. Small diode 52 is a relatively small diode that consumes a small amount of circuit or die area and is inexpensive. This is in contrast to a power Schottky diode.

FET 46, discussed more fully below, may be implemented as a FET having a somewhat small channel area so that a small start-up current may be provided to the second node to prevent clamping circuit 100 from locking into a stable operating state when $I_1$ and $I_2$ are initially equal to zero. A compensation capacitor 48 is also provided between the second node and ground so that FET 50, acting as a switch, does not oscillate between an on and off state.

In operation, a divider voltage is generated between resistor 30 and resistor 32 that corresponds to the voltage at node C. The divider voltage controls the base of first BJT 38 and second BJT 40. BJT 38 and second BJT 40 are shown in the implementation of FIG. 2 as npn bipolar junction transistors. As a result of the divider voltage, $I_1$ is generated through first BJT 38, and $I_2$ is generated through second BJT 40. The value of $I_1$ and $I_2$ are established by the base voltage provided by the divider voltage and the values of trigger point resistor 42 and resistor 44. Also, the emitter area of first BJT 38 and second BJT 40 influence the relative size of $I_1$ and $I_2$.

First BJT 38, second BJT 40, trigger point resistor 42, and resistor 44 are sized and designed so that when the divider voltage is provided at an amplitude below a trigger voltage value, $I_1$ is greater than $I_2$. Correspondingly, when the divider voltage is provided at an amplitude greater than the trigger voltage, $I_2$ is greater than $I_1$. The trigger voltage corresponds to the clamping voltage at node C that should not be exceeded.

Any of the variety of circuit values may be provided to establish a desired trigger voltage. For example, in the one embodiment illustrated in FIG. 2, resistor 30 may be provided as a twenty-nine kiloohm resistor and resistor 32 as a seven kiloohm resistor. In such a case, the divider voltage would be equal to a trigger voltage of 1.25 volts if the clamping voltage at node C was six volts. As such, when the divider voltage is provided below 1.25 volts, $I_1$ should be greater than $I_2$, and when the divider voltage is provided above 1.25 volts, $I_2$ should be greater than $I_1$. To accomplish this, first FET 38 may be provided with an emitter area four times greater than the emitter area of second BJT 40 and trigger point resistor 42 may be provided as a 500 ohm resistor. Resistor 44 may be provided as a two kiloohm resistor.

The current mirror circuit of FET 34 and FET 36, both implemented as p-channel FETs, mirror $I_1$ from FET 34 and through FET 36 to the second node where second BJT 40 provides $I_2$. Whenever the divider voltage is less than the trigger voltage, $I_1$ is greater than $I_2$ and hence the charge flowing into the second node is greater than the charge leaving the second node resulting in the generation of a reference voltage at the second node that is increasing in value. After a period of time, the current through FET 36 will equal $I_2$ and a steady state condition will exist. During this time in which divider voltage is provided at a level below the trigger voltage, the gate-to-source voltage of FET 50 will be such that FET 50 operates as an open switch and no current or control signal will be provided to the base of LSD 20.

When the voltage at node C equals or exceeds the clamped voltage, the divider voltage will be provided at a level that equals or exceeds the trigger voltage. As a result, $I_2$ will be greater than $I_1$ and the reference signal or voltage generated at the second node will be reduced because the charge entering the second node will be less than the charge leaving the second node. After a period of time, the current through $I_2$ will be equal to $I_1$ and a steady state condition will exist. As a result of the decreased voltage of the reference signal, the gate-to-source voltage of FET 50 will be such that FET 50 operates as a closed switch and the control signal will be provided through small diode 52 to the gate of LSD 20. As a consequence, LSD 20 acts as a closed switch and provides a current path to dissipate or reduce the voltage at node C.

As is shown, clamping circuit 100 does not require any external power supply and thus will operate whether external power has been provided or not. For example, if power is shut off or removed from stator winding current regulation circuit 10 and a corresponding inductive voltage spike is generated at node C because of the change in current, clamping circuit 100 will clamp the voltage at node C.

Whenever $I_1$ and $I_2$ are both equal to zero, clamping circuit 100 is in a stable or balanced state. As a consequence of this balanced state, as the voltage at node C begins to rise, $I_1$ and $I_2$ may remain at zero. This may be solved by the introduction of FET 46 so that a small current may be provided to the second node resulting in a current imbalance. FET 46 is shown in FIG. 2 as a p-channel MOSFET with its drain and gate coupled together and its source coupled to node C to provide the small startup current. FET 46 may have a small channel width to channel length ratio such as, for example, a channel width of two microns and a channel length of fifty microns. Furthermore, when the reference signal or voltage at the second node is such that FET 50 is on the verge of turning on or off, clamping circuit 100 may suffer from oscillations because FET 50 is turning on and off. The oscillations may be solved, as mentioned above, through the introduction of compensation capacitor 48 so that the changes in the reference signal or voltage are dampened or reduced so that the oscillations are prevented.

Thus, clamping circuit 100 clamps the voltage at node C to prevent the voltage at node C from exceeding a breakdown voltage and destroying associated circuitry. Although clamping circuit 100 has been illustrated in FIG. 2 using npn bipolar junction transistors and p-channel FETs, it should be understood that the present invention is in no way limited to the selection shown in FIG. 2. In fact, clamping circuit 100 may be implemented using pnp bipolar junction transistors and n-channel FETs to perform the same or similar functions as the circuitry illustrated in FIG. 2.

Thus, it is apparent that there has been provided, in accordance with the present invention, a clamping circuit and method for clamping a voltage that satisfy the advantages set forth above. Although the preferred embodiment has been described in detail, it should be understood that various changes, substitutions, and alterations can be made herein without departing from the scope of the present invention. For example, although the present invention has been illustrated and described with respect to clamping a stator winding voltage of a three-phase dc motor, the present invention is not limited only to applications involving the clamping of stator winding voltages. Also, even though the present invention has been described and shown as being implemented using field-effect transistor technology and bipolar junction transistor technology, it should be understood that the present invention is not so limited. Also, the field-effect transistor technology illustrated as PMOS circuitry may be implemented using NMOS circuitry and vice versa, similarly, the bipolar junction transistor technology illustrated as npn circuitry may be implemented using pnp circuitry and vice versa. The circuits described and illustrated in the preferred embodiment as discrete or separate circuits may be combined into one circuit or split into separate circuits without departing from the scope of the present invention. Furthermore, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention as defined by the following claims.

What is claimed is:

1. A clamping circuit for controlling an external switch in response to monitoring a voltage at a first node, the external switch operable to close to complete a current path to reduce the voltage at the first node in response to receiving a control signal from the clamping circuit, the clamping circuit comprising:

a voltage divider circuit coupled to the first node at a first end and a fourth node at a second end, the voltage divider operable to generate a divider voltage at a third node that is proportional to the voltage at the first node;

a first device operable to receive the divider voltage and to generate a first current in response;

a second device operable to receive the divider voltage and to generate a second current in response;

a current mirror circuit operable to receive the first current from the first device and to mirror the first current to the second device at a second node to generate a reference signal at the second node in response, the current mirror circuit being biased by the first node, the reference signal corresponding to an initial difference between the first current and the second current as established by the divider voltage; and a switch operable to receive the reference signal and to provide the control signal to the external switch when the reference signal is received at an amplitude that exceeds a threshold level indicating that the voltage at the first node is too high.

2. The clamping circuit of claim 1, wherein the amplitude of the reference signal exceeds the threshold level when the divider voltage is generated at an amplitude that exceeds a trigger voltage.

3. The clamping circuit of claim 2, wherein the clamping circuit reaches steady state after the divider voltage is provided at a substantially constant level for a period of time.

4. The clamping circuit of claim 3, wherein the amplitude of one of the first current and the second current is initially greater than the amplitude of remaining one of the first current and the second current when the amplitude of the divider voltage is less than the trigger voltage, and the amplitude of the one of the first current and the second current is initially less than the amplitude of the remaining one of the first current and the second current when the amplitude of the divider voltage is greater than the trigger voltage.

5. The clamping circuit of claim 3, wherein the amplitude of the first current is initially greater than the amplitude of the second current when the divider voltage is generated at an amplitude below the trigger voltage, and wherein the amplitude of the first current is initially less than the amplitude of the second current when the divider voltage is generated at an amplitude above the trigger voltage.

6. The clamping circuit of claim 3, wherein the amplitude of the first current is initially less than the amplitude of the second current when the divider voltage is generated at an amplitude below the trigger voltage, and wherein the amplitude of the first current is initially greater than the amplitude of the second current when the divider voltage is generated at an amplitude above the trigger voltage.

7. The clamping circuit of claim 4, wherein the first node for coupling to a stator winding coil and the voltage to be monitored is the voltage generated by the stator winding of a polyphase, direct current motor.

8. The clamping circuit of claim 4, wherein the first device includes:

a first bipolar junction transistor having a base, an emitter, and a collector, the base coupled to the voltage divider at the third node to receive the divider voltage, and the collector coupled to the current mirror circuit so that the first current generated through the first bipolar junction transistor is provided to the current mirror circuit; and a trigger point resistor, having a first end and a second end, coupled to the emitter of the first bipolar junction transistor at the first end.

9. The clamping circuit of claim 8, wherein the second device includes a second bipolar junction transistor having a base, an emitter, and a collector, the base coupled to the voltage divider at the third node to receive the divider voltage and to generate the second current through the second bipolar junction transistor, the collector coupled to the current mirror circuit so that the first current mirrored from the first bipolar junction transistor is provided to the second node along with the second current to generate the reference signal, and the emitter coupled to the second end of the trigger point resistor and the fourth node.

10. The clamping circuit of claim 9, wherein the size of the emitter of the first bipolar junction transistor, the emitter of the second bipolar junction transistor, and the trigger point resistor are provided at sizes to ensure that the amplitude of the reference signal exceeds the threshold level when the amplitude of the divider voltage exceeds the desired trigger voltage.

11. The clamping circuit of claim 4, wherein the reference signal is the voltage at the second node.

12. A clamping circuit for controlling an external switch in response to monitoring a voltage at a first node, the external switch operable to close to complete a current path to reduce the voltage at the first node in response to receiving a control signal from the clamping circuit, the clamping circuit comprising:

a voltage divider circuit coupled to the first node at a first end and a fourth node at a second end, the voltage divider operable to generate a divider voltage at a third node that is proportional to the voltage at the first node;

a first device operable to receive the divider voltage and to generate a first current in response;

a second device operable to receive the divider voltage and to generate a second current in response;

a current mirror circuit operable to receive the first current from the first device and to mirror the first current to the second device at a second node to generate a reference signal at the second node in response, the reference signal corresponding to the initial difference between the first current and the second current as established by the divider voltage; and a switch operable to receive the reference signal and to provide the control signal to the external switch when the reference signal is received at an amplitude that exceeds a threshold level indicating that the voltage at the first node is too high;

wherein the amplitude of the reference signal exceeds the threshold level when the divider voltage is generated at an amplitude that exceeds a trigger voltage;

wherein the clamping circuit reaches steady state after the divider voltage is provided at a somewhat constant level for a period of time;

wherein the amplitude of one of the first current and the second current is initially greater than the amplitude of remaining one of the first current and the second current when the amplitude of the divider voltage is less than the trigger voltage, and the amplitude of the one of the first current and the second current is initially less than the amplitude of the remaining one of the first current and the second current when the amplitude of the divider voltage is greater than the trigger voltage;

wherein the first device includes:

a first bipolar junction transistor having a base, an emitter, and a collector, the base coupled to the voltage divider at the third node to receive the divider voltage, and the collector coupled to the current mirror circuit so that the first current generated through the first bipolar junction transistor is provided to the current mirror circuit; and a trigger point resistor, having a first end and a second end, coupled to the emitter of the first bipolar junction transistor at the first end;

wherein the second device includes a second bipolar junction transistor having a base, an emitter, and a collector, the base coupled to the voltage divider at the third node to receive the divider voltage and to generate the second current through the second bipolar junction transistor, the collector coupled to the current mirror circuit so that the first current mirrored from the first bipolar junction transistor is provided to the second node along with the second current to generate the reference signal, and the emitter coupled to the second end of the trigger point resistor and the fourth node;

wherein a compensation capacitor is coupled between the second node and the fourth node, and a field-effect transistor is coupled between the first node and the second node and is operable to provide a current to the second node.

13. A clamping circuit for controlling an external switch in response to monitoring a voltage at a first node, the external switch operable to close to complete a current path to reduce the voltage at the first node in response to receiving a control signal from the clamping circuit, the clamping circuit comprising:

a voltage divider circuit coupled to the first node at a first end and a fourth node at a second end, the voltage divider operable to generate a divider voltage at a third node that is proportional to the voltage at the first node;

a first device operable to receive the divider voltage and to generate a first current in response;

a second device operable to receive the divider voltage and to generate a second current in response;

a current mirror circuit operable to receive the first current from the first device and to mirror the first current to the second device at a second node to generate a reference signal at the second node in response, the reference signal corresponding to the initial difference between the first current and the second current as established by the divider voltage; and a switch operable to receive the reference signal and to provide the control signal to the external switch when the reference signal is received at an amplitude that exceeds a threshold level indicating that the voltage at the first node is too high;

wherein the amplitude of the reference signal exceeds the threshold level when the divider voltage is generated at an amplitude that exceeds a trigger voltage;

wherein the clamping circuit reaches steady state after the divider voltage is provided at a somewhat constant level for a period of time;

wherein the amplitude of one of the first current and the second current is initially greater than the amplitude of remaining one of the first current and the second current when the amplitude of the divider voltage is less than the trigger voltage, and the amplitude of the one of the first current and the second current is initially less than the amplitude of the remaining one of the first current and the second current when the amplitude of the divider voltage is greater than the trigger voltage;

wherein the current mirror circuit is implemented using field-effect transistors.

14. A clamping circuit for controlling an external switch in response to monitoring a voltage at a first node, the external switch operable to close to complete a current path to reduce the voltage at the first node in response to receiving a control signal from the clamping circuit, the clamping circuit comprising:

a voltage divider circuit coupled to the first node at a first end and a fourth node at a second end, the voltage divider operable to generate a divider voltage at a third node that is proportional to the voltage at the first node;

a first device operable to receive the divider voltage and to generate a first current in response;

a second device operable to receive the divider voltage and to generate a second current in response;

a current mirror circuit operable to receive the first current from the first device and to mirror the first current to the second device at a second node to generate a reference signal at the second node in response, the reference signal corresponding to the initial difference between the first current and the second current as established by the divider voltage; and a switch operable to receive the reference signal and to provide the control signal to the external switch when the reference signal is received at an amplitude that exceeds a threshold level indicating that the voltage at the first node is too high;

wherein the amplitude of the reference signal exceeds the threshold level when the divider voltage is generated at an amplitude that exceeds a trigger voltage;

wherein the clamping circuit reaches steady state after the divider voltage is provided at a somewhat constant level for a period of time;

wherein the amplitude of one of the first current and the second current is initially greater than the amplitude of remaining one of the first current and the second current when the amplitude of the divider voltage is less than the trigger voltage, and the amplitude of the one of the first current and the second current is initially less than the amplitude of the remaining one of the first current and the second current when the amplitude of the divider voltage is greater than the trigger voltage;

wherein the switch is implemented as a field-effect transistor device having a gate, a drain, and a source, the field-effect transistor device coupled between the first node and the external switch through the drain and the source, and the gate coupled to the second node to receive the reference signal.

15. The clamping circuit of claim 14, further comprising a diode coupled between the switch and the external switch to prevent current from flowing from the external switch to the switch.

16. The clamping circuit of claim 15, wherein the external switch is a power field-effect transistor for controlling the current through a stator winding coil.

* * * * *